US011233075B2

(12) United States Patent
Fang et al.

(10) Patent No.: US 11,233,075 B2
(45) Date of Patent: Jan. 25, 2022

(54) ARRAY SUBSTRATE AND DISPLAY PANEL

(71) Applicant: Wuhan China Star Optoelectronics Semiconductor Display Technology Co., Ltd., Wuhan (CN)

(72) Inventors: Liang Fang, Wuhan (CN); Ding Ding, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 123 days.

(21) Appl. No.: 16/768,896

(22) PCT Filed: Mar. 6, 2020

(86) PCT No.: PCT/CN2020/078248
§ 371 (c)(1),
(2) Date: Jun. 2, 2020

(87) PCT Pub. No.: WO2021/027277
PCT Pub. Date: Feb. 18, 2021

(65) Prior Publication Data
US 2021/0408085 A1 Dec. 30, 2021

(30) Foreign Application Priority Data

Aug. 12, 2019 (CN) .................. 201910740864.X

(51) Int. Cl.
*H01L 27/12* (2006.01)
*H01L 27/32* (2006.01)
*G02F 1/1368* (2006.01)

(52) U.S. Cl.
CPC ........ *H01L 27/1255* (2013.01); *H01L 27/124* (2013.01); *G02F 1/13685* (2021.01); *H01L 27/3265* (2013.01)

(58) Field of Classification Search
CPC .............. H01L 27/1255; H01L 27/124; H01L 27/3265; G02F 1/13685
See application file for complete search history.

(56) References Cited

U.S. PATENT DOCUMENTS

| 2007/0202625 A1 | 8/2007 | Park et al. |
| 2018/0130409 A1 | 5/2018 | Xiang et al. |
| 2020/0127071 A1 | 4/2020 | Chen |

FOREIGN PATENT DOCUMENTS

| CN | 107274829 | 10/2017 |
| CN | 108831906 | 11/2018 |
| CN | 109064977 | 12/2018 |

*Primary Examiner* — Anne M Hines

(57) ABSTRACT

The present disclosure provides an array substrate and a display panel, which adopt a design of a single-gated layer, in which a first electrode plate of a storage capacitor is formed in the gate layer and a second electrode plate of the storage capacitor and various functional connection wires are formed in a source/drain layer. Paths used for electric current between different film layers are realized by various functional connection wires. Therefore, a layer of gate structure is omitted, one photomask process is saved, production cost is reduced, and a problem of high production costs of the current display devices is solved.

20 Claims, 7 Drawing Sheets

ARRAY SUBSTRATE AND DISPLAY PANEL

RELATED APPLICATIONS

This application is a National Phase of PCT Patent Application No. PCT/CN2020/078248 having International filing date of Mar. 6, 2020, which claims the benefit of priority of Chinese Patent Application No. 201910740864.X filed on Aug. 12, 2019. The contents of the above applications are all incorporated by reference as if fully set forth herein in their entirety.

FIELD AND BACKGROUND OF THE INVENTION

The present disclosure relates to the technical field of displays, and specifically to an array substrate and a display panel.

In order to precisely control current and improve uniformity of light emission in current display devices, a driving circuit is generally designed as a compensation circuit of 7T1C as shown in FIG. 1, in which a gate layer of the circuit adopts a double-layered design, in which two gate layers are served as a first electrode plate and a second electrode plate of a storage capacitor.

However, the design of double-layered gate increases production cost for the products.

Therefore, current display devices have a problem of high production cost, which needs to be solved.

SUMMARY OF THE INVENTION

The present disclosure provides a novel array substrate and a novel display panel, in order to solve a problem of high production costs for current display devices.

In order to solve the above problem, the technical solution provided by the present disclosure is as follows.

The present disclosure provides an array substrate, which includes:
a substrate;
a buffer layer formed over the substrate;
an active layer formed on the buffer layer and patterned to form an active region of a thin film transistor, wherein the active region includes doped regions and a channel region;
a gate insulation layer formed on the active layer and the buffer layer;
a gate layer formed on the gate insulation layer and patterned to form a first electrode plate of a storage capacitor, a gate, and scan lines;
an interlayer dielectric layer formed on the gate layer and the gate insulation layer;
a source/drain layer formed on the interlayer dielectric layer and patterned to form a second electrode plate of the storage capacitor, a source, and a drain; and
a passivation layer formed on the source/drain layer and the interlayer dielectric layer.

In the array substrate of the present disclosure, the second electrode plate is provided with a notch, and a first connection via is provided within a region corresponding to the notch; and the source/drain layer is patterned to form a first connection wire, one end of the first connection wire is connected to the first electrode plate through the first connection via, and the other end of the first connection wire is connected to doped regions of a target thin film transistor through a second connection via.

In the array substrate of the present disclosure, the first electrode plate is provided with a protruding portion, and a third connection via is provided within a region corresponding to the protruding portion; and the source/drain layer is further patterned to form a second connection wire, one end of the second connection wire is connected to the first electrode plate through the third connection via, and the other end of the second connection wire is connected to doped regions of a target thin film transistor through a fourth connection via.

In the array substrate of the present disclosure, the source/drain layer is further patterned to form a power line and a power connection wire, and the second electrode plate is connected to the power line via the power connection wire.

In the array substrate of the present disclosure, the power connection wire has a hollow mesh-shaped structure.

In the array substrate of the present disclosure, the source/drain layer is further patterned to form a power line, and one side of the second electrode plate is integrated with the power line.

In the array substrate of the present disclosure, the gate layer is further patterned to form a signal-resetting wire, the signal-resetting wire is disconnected within a region corresponding to the channel region; and the source/drain layer is further patterned to form a reset-connecting wire, wherein the signal-resetting wire is connected to one end of the reset-connecting wire through a fifth connection via, and the other end of the reset-connecting wire is connected to a signal-resetting wire of a neighboring sub-pixel through a sixth connection via.

In the array substrate of the present disclosure, the source/drain layer is further patterned to form a reset-forwarding wire, wherein the signal-resetting wire is connected to one end of the reset-forwarding wire through a seven connection via, and the other end of the reset-forwarding wire is connected to a channel region of a target thin film transistor through an eighth connection via.

In the array substrate of the present disclosure, a material of the source/drain layer is at least one of molybdenum, aluminum, aluminum-nickel alloy, molybdenum-tungsten alloy, chromium, copper, or titanium-aluminum alloy.

In the array substrate of the present disclosure, a material of the interlayer dielectric layer is silicon nitride or silicon oxide.

In the array substrate of the present disclosure, a material of the gate layer is at least one of molybdenum, aluminum, aluminum-nickel alloy, molybdenum-tungsten alloy, chromium, copper, or titanium-aluminum alloy.

In the array substrate of the present disclosure, a material of the gate insulation layer is at least one of silicon nitride, silicon oxide, or silicon oxynitride.

In the array substrate of the present disclosure, a material of the buffer layer is at least one of silicon nitride or silicon oxide.

In the array substrate of the present disclosure, a material of the barrier layer is silicon oxide.

In the array substrate of the present disclosure, the substrate is one of a glass substrate, a quartz substrate, or a resin substrate.

In the array substrate of the present disclosure, the substrate is a flexible substrate.

In the array substrate of the present disclosure, material of the substrate being the flexible substrate includes Polyimide.

Meanwhile, the present disclosure further provides a display panel, which includes the array substrate as described above.

The display panel provided by the present disclosure is a display panel configured for a liquid crystal display (LCD), which further includes:

a color film substrate; and liquid crystal filled between the color film substrate and the array substrate.

The display panel provided by the present disclosure is a display panel configured for an organic light emitting diode (OLED), which further includes:

a pixel definition layer formed over the passivation layer and patterned to form a light-emitting definition region;

a light-emitting material layer formed within the light-emitting definition region;

a common electrode layer formed over the light-emitting material layer and the pixel definition layer; and an encapsulation layer formed over the common electrode layer.

The present disclosure provides an array substrate and a display panel. The array substrate includes a substrate, a buffer layer, an active layer, a gate insulation layer, a gate layer, an interlayer dielectric layer, a source/drain layer, and a passivation layer, which are arranged in a stacked manner. By adopting a design of a single-gated layer, a first electrode plate of a storage capacitor is formed within the gate layer, and a second electrode plate of the storage capacitor and various functional connection wires are formed within a source/drain layer. Paths used for electric current between different film layers are realized by various functional connection wires. Therefore, one layer of a gated structure is omitted, one photomask process is saved, production cost is reduced, and a problem of high production cost of the current display devices is solved.

DESCRIPTION OF THE SPECIFIC EMBODIMENTS OF THE INVENTION

The present disclosure provides an array substrate and a display panel. In order to make purposes, technical solutions, and effects of the present disclosure more clear and unambiguous, the present disclosure is further described in detail below with reference to the accompanying drawings and embodiments. It should be understood that the specific embodiments described herein are only used to explain the present disclosure, and are not used to limit the present disclosure.

In order to solve a problem of high production cost of the current display devices, the present disclosure provides an array substrate, which includes:

a substrate;

a buffer layer formed over the substrate;

an active layer formed on the buffer layer and patterned to form an active region of a thin film transistor, wherein the active region includes doped regions and a channel region;

a gate insulation layer formed on the active layer and the buffer layer;

a gate layer formed on the gate insulation layer and patterned to form a first electrode plate of a storage capacitor, a gate, and scan lines;

an interlayer dielectric layer formed on the gate layer and the gate insulation layer;

a source/drain layer formed on the interlayer dielectric layer and patterned to form a second electrode plate of the storage capacitor, a source, and a drain; and a passivation layer formed on the source/drain layer and the interlayer dielectric layer.

The present disclosure provides an array substrate, which adopts a design of a single-gated layer, in which a first electrode plate of a storage capacitor is formed in the gate layer, and a second electrode plate of the storage capacitor and various functional connection wires are formed in a source/drain layer. Paths used for electric current between different film layers are realized by various functional connection wires. Therefore, one layer of a gated structure is omitted, one photomask process is saved, production cost is reduced, and a problem of high production cost of the current display devices is solved.

Figure 1:
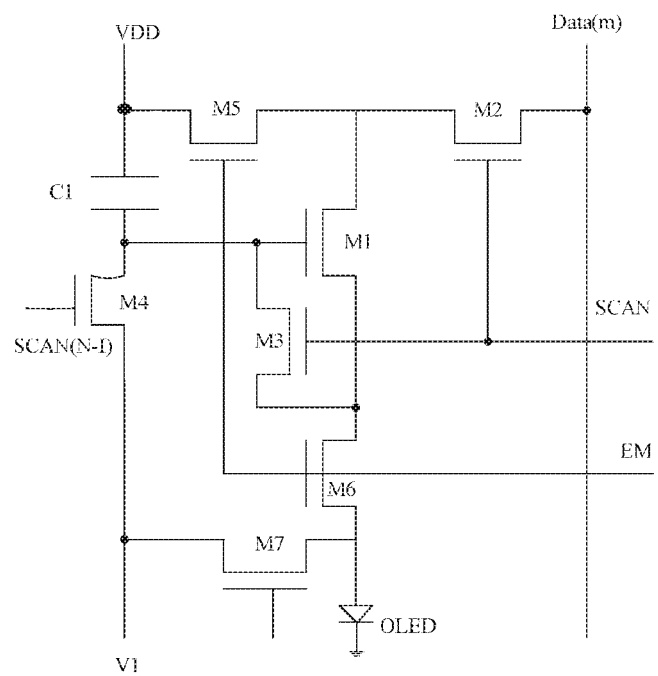
FIG. 1 is a circuit design diagram illustrating a current display device.
Figure 2:
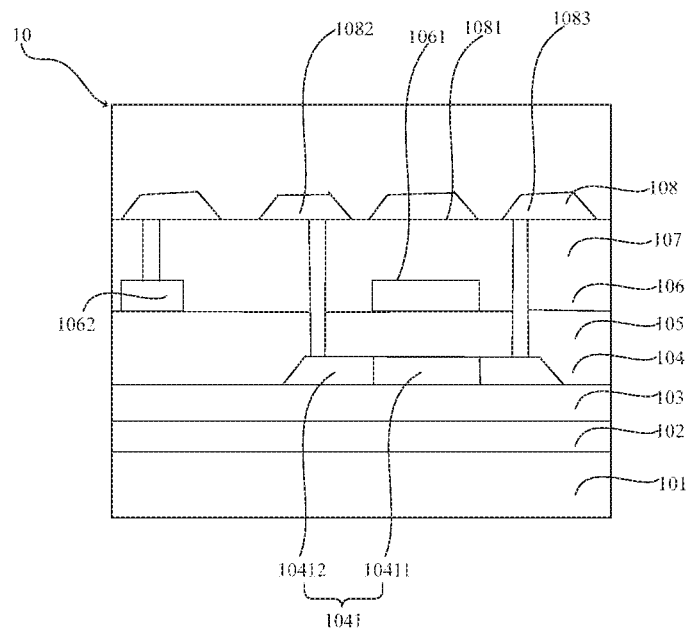
FIG. 2 is a schematic structural diagram illustrating an array substrate provided by the present disclosure.
Figure 3:
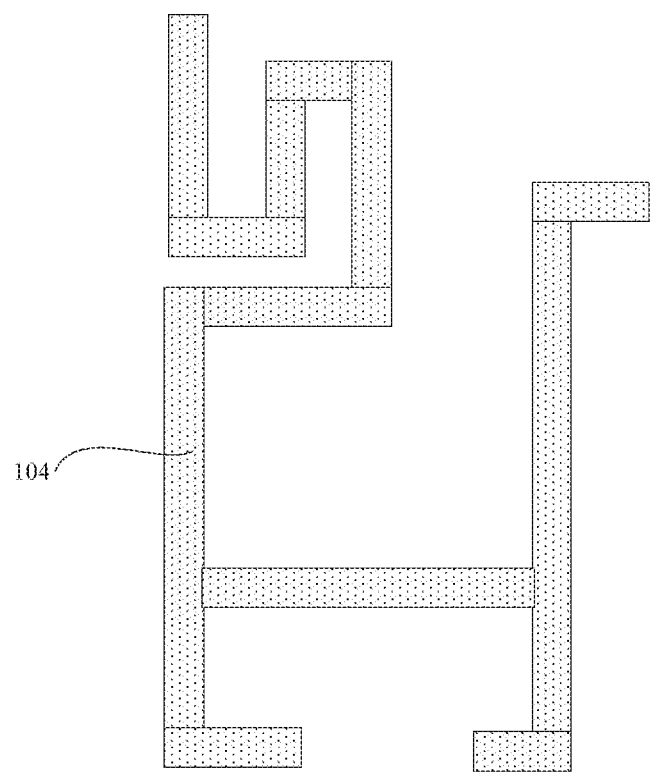
FIG. 3 is a first schematic plan view illustrating an active layer of the array substrate provided by the present disclosure.
Figure 4:
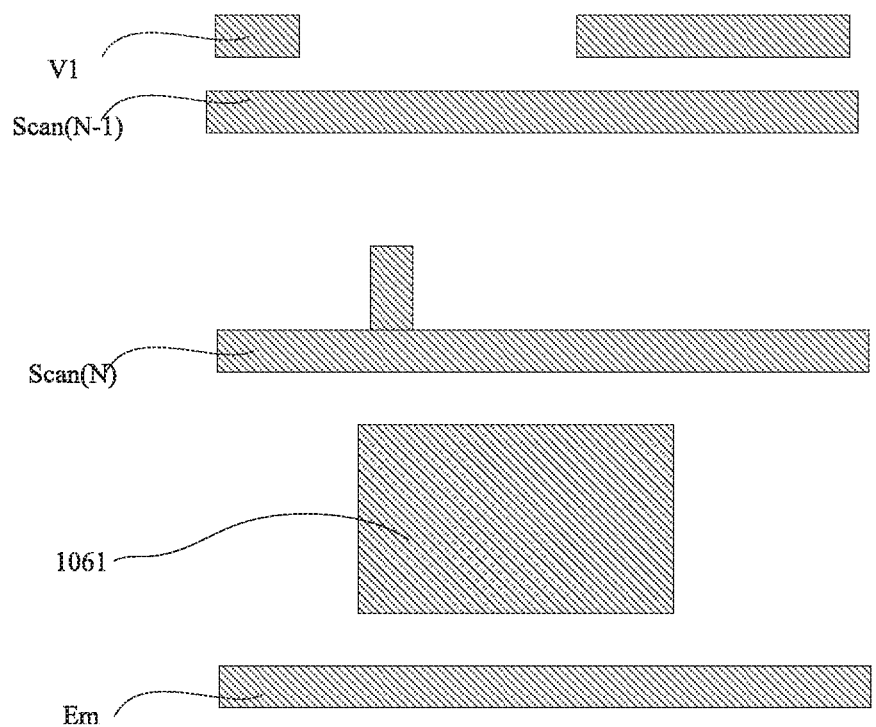
FIG. 4 is a first schematic plan view illustrating a gate layer of the array substrate provided by the present disclosure.
Figure 5:
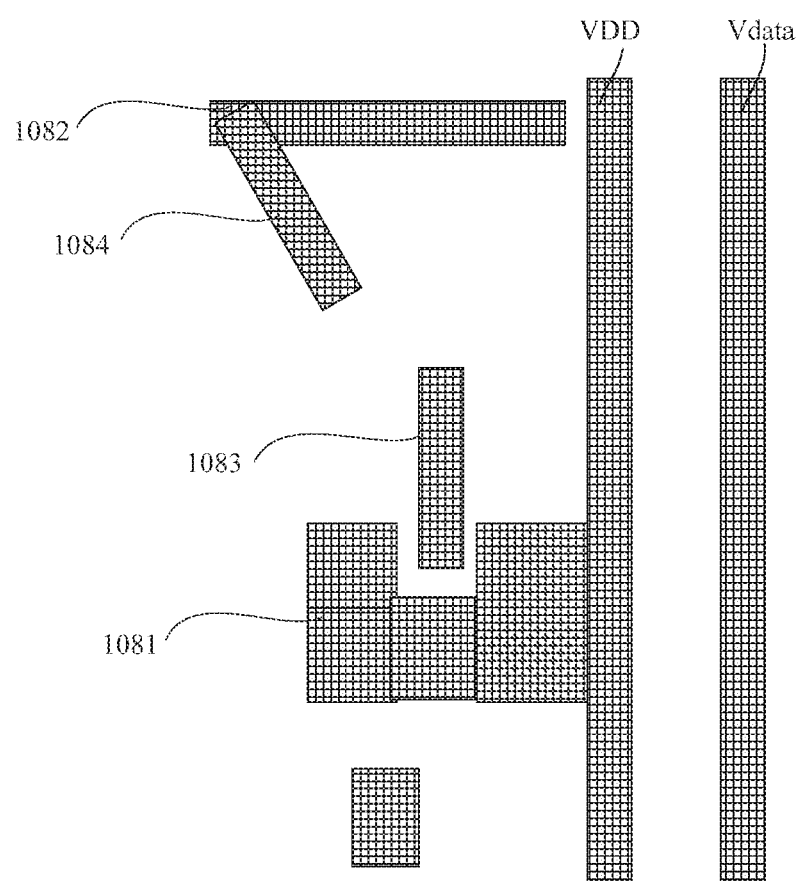
FIG. 5 is a first schematic plan view illustrating a source/drain layer of the array substrate provided by the present disclosure.
Figure 6:
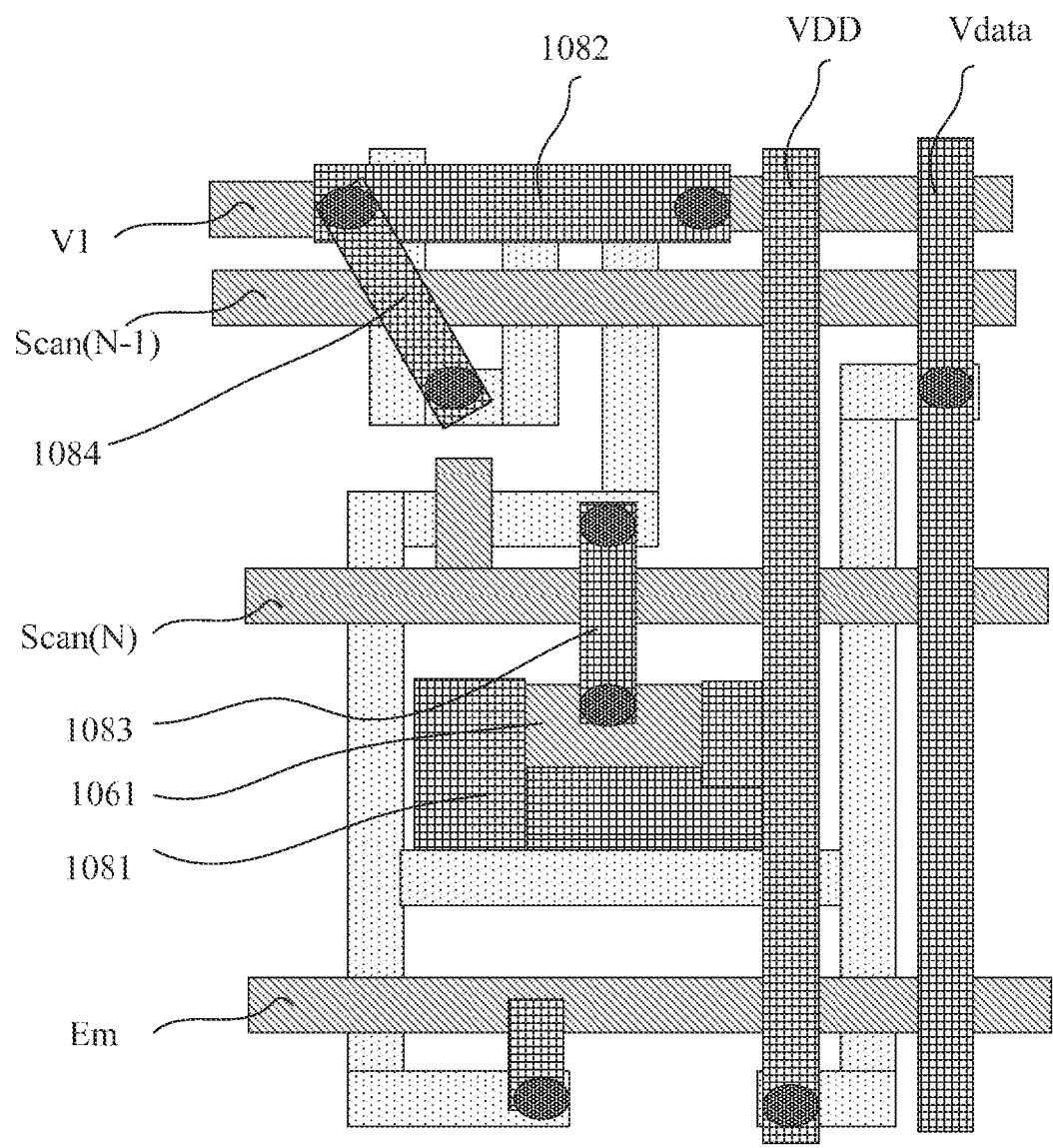
FIG. 6 is a first schematic plane-overlaid view illustrating the active layer, the gate layer, and the source/drain layer of the array substrate provided by the present disclosure.
Figure 7:
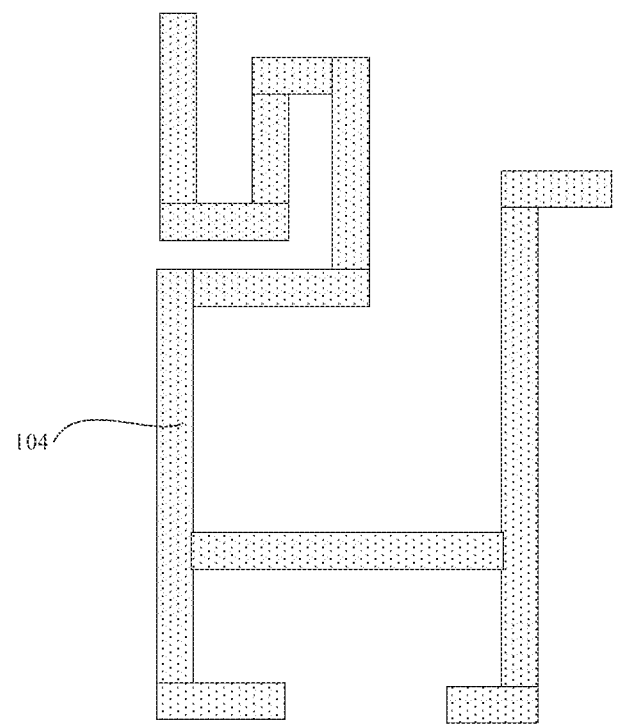
FIG. 7 is a second schematic plan view illustrating the active layer of the array substrate provided by the present disclosure.
Figure 8:
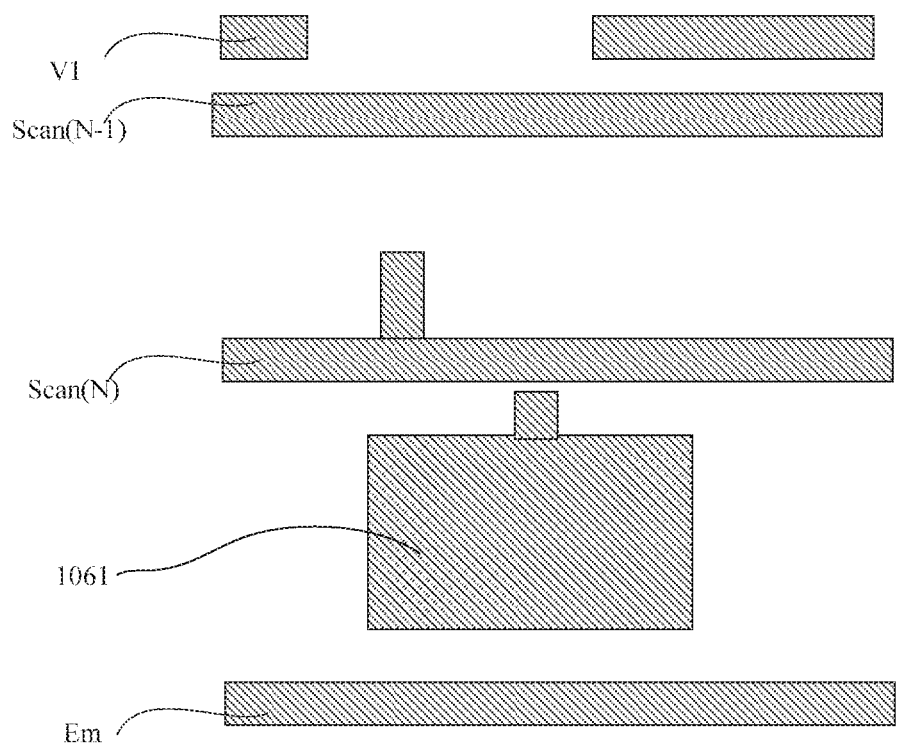
FIG. 8 is a second schematic plan view illustrating the gate layer of the array substrate provided by the present disclosure.
Figure 9:
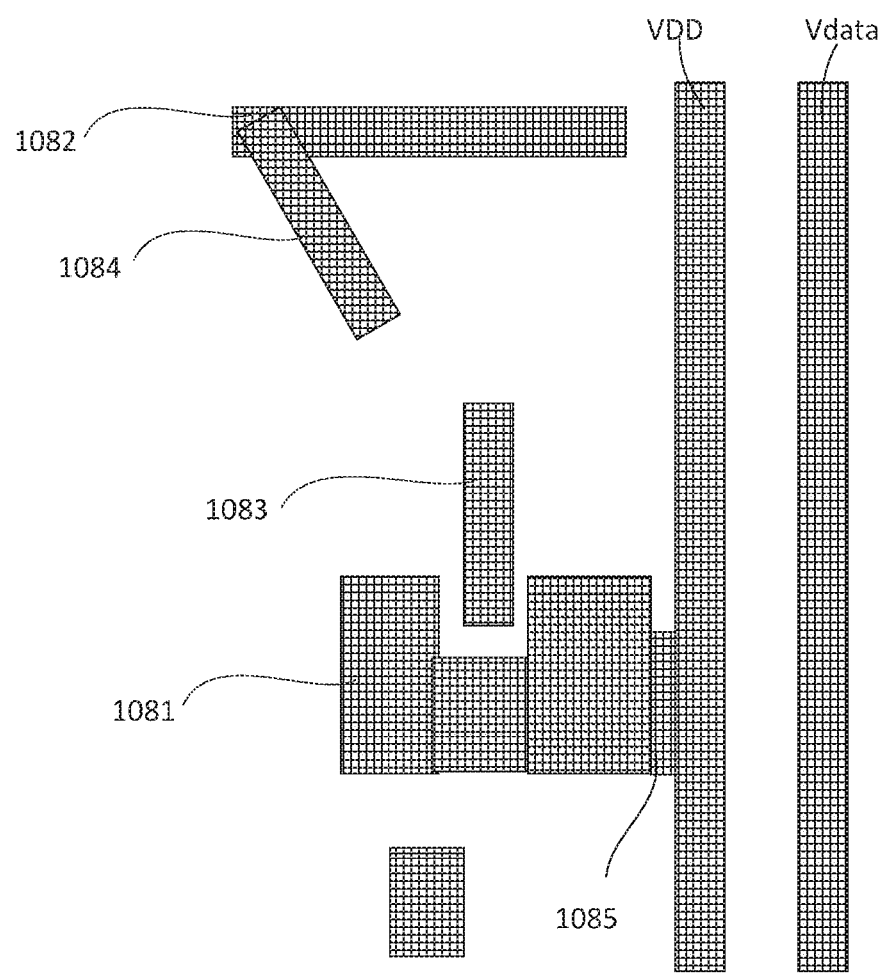
FIG. 9 is a second schematic plan view illustrating the source/drain layer of the array substrate provided by the present disclosure.
Figure 10:
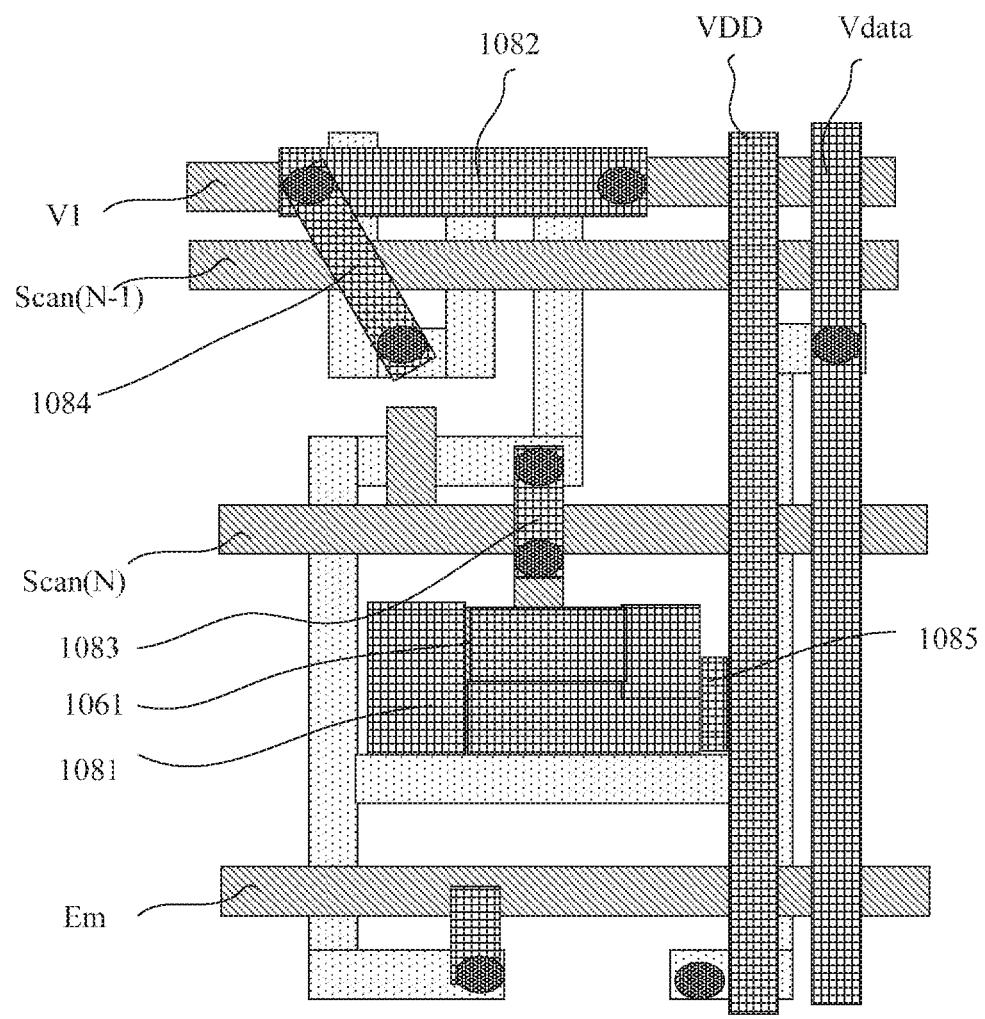
FIG. 10 is a second schematic plane-overlaid view illustrating the active layer, the gate layer, and the source/drain layer illustrating the array substrate provided by the present disclosure.

In an embodiment, as shown in FIG. 2, an array substrate 10 provided by the present disclosure includes parts described as follows.

A substrate 101, in this embodiment, the substrate 101 may be one of a glass substrate, a quartz substrate, or a resin substrate, wherein the substrate 101 may also be a flexible substrate, and material of the flexible substrate may include Polyimide.

A barrier layer 102, which is located on the substrate 101. In this embodiment, a material of the barrier layer 102 is silicon oxide.

A buffer layer 103, which is formed on the barrier layer 102, wherein the buffer layer 103 is mainly configured for a cushion of pressure between membrane structures, wherein the buffer layer 103 can also have a certain function of blocking water and oxygen. In this embodiment, a material of the buffer layer 103 is one or a mixture of more of silicon nitride or silicon oxide.

An active layer 104, which is formed on the buffer layer 103. In this embodiment, the active layer 104 includes an active region 1041 including a channel region 10411 and doped regions 10412 located on two sides of the channel region 10411. The doped regions 10412 may be formed, by using the corresponding buffer layer 103 blocking the channel region 10411, and by doping ions to regions on two sides of the channel region 10411.

A gate insulation layer 105, which is formed on the active layer 104 and the buffer layer, wherein the gate insulation layer 105 is mainly configured to isolate the active layer 104 and metal layers above the active layer 104. In this embodiment, a material of the gate insulation layer 105 may be an inorganic insulation material, such as silicon nitride, silicon oxide, or silicon oxynitride.

A gate layer 106, which is formed on the gate insulation layer 105, wherein the gate layer 106 is patterned to form a first electrode plate 1061 of a storage capacitor, a gate, and scan lines 1062. Meanwhile, the first electrode plate 1061 serves as a gate of a thin film transistor. In addition, a material of the gate layer 106 may adopt one of metal materials, such as molybdenum, aluminum, aluminum-nickel alloy, molybdenum-tungsten alloy, chromium, copper, or titanium-aluminum alloy. Alternatively, a mixture of the above metal materials may be adopted.

An interlayer dielectric layer 107, which is formed on the gate insulation layer 105 and the gate layer 106, wherein the interlayer dielectric layer is mainly configured to isolate the gate layer 106 and metal layers over the gate layer 106. In this embodiment, a material of the interlayer dielectric layer 107 is silicon nitride or silicon oxide.

A source/drain layer 108, which is formed on the interlayer dielectric layer 107, wherein the source/drain layer 108 is patterned to form a second electrode plate 1081 of the storage capacitor, a source 1082, and a drain 1083. In addition, a material of the source/drain layer 108 may adopt one of metal materials, such as molybdenum, aluminum, aluminum-nickel alloy, molybdenum-tungsten alloy, chromium, copper, or titanium-aluminum alloy. Alternatively, a mixture of the above metal materials may be adopted.

In this embodiment, please refer to FIGS. 3 to 6, the gate layer 106 is located over the active layer 104, in the array substrate provided by the present disclosure.

In this embodiment, the gate layer 106 includes the gate, the signal-resetting wire VI, the scan lines Scan(N), Scan(N−1), an enable signal wire Em, and the first electrode plate 1061 of the storage capacitor. In addition, the gate, the signal-resetting wire VI, the scan lines Scan(N), Scan(N−1), the enable signal wire Em, and the first electrode plate 1061 of the storage capacitor, are formed by a same photomask process.

In this embodiment, the gate layer 106 further includes the signal-resetting wire VI. The signal-resetting wire VI is disconnected within a region corresponding to the active layer 104.

The source/drain layer 108 is located over the gate layer 106.

In this embodiment, the source/drain layer 108 includes the source, the drain, a data signal wire Vdata, the power line VDD, the second electrode plate 1081 of the storage capacitor, a reset-connecting wire 1082, a first connection wire 1083, and a reset-forwarding wire 1084. The source, the drain, the data signal wire Vdata, the power line VDD, the second electrode plate 1081 of the storage capacitor, the reset-connecting wire 1082, the first connection wire 1083, and the reset-forwarding wire 1084, are formed by a same photomask process.

In an embodiment, the second electrode plate 1081 of the storage capacitor formed within the source/drain layer 108 has a notch, which is configured to provide with a first connection via. One end of the first connection wire 1083 is connected to the first electrode plate 1061 through the first connection via, and the other end of the first connection wire 1083 is connected to the active layer 104 through a second via.

In an embodiment, the notch is shaped as at least one of a rectangle, a trapezoid, a circular ring, or a triangle. In this embodiment, the notch is shaped as a rectangle.

In an embodiment, one end of the reset-connecting wire 1082 is connected to the signal-resetting wire VI through a fifth connection via, and the other end of the reset-connecting wire 1082 is connected to a signal-resetting wire VI of a neighboring sub-pixel through a sixth connection via. The reset-connecting wire 1082 is parallel to the signal-resetting wire VI.

A width of the reset-connecting wire 1082 is greater than a width of the signal-resetting wire VI, in order to decrease resistance and reduce voltage drop.

In an embodiment, one end of the reset-forwarding wire 1084 is connected to the signal-resetting wire VI through a seventh connection via, and the other end of the reset-forwarding wire 1084 is connected to the active layer 104 through an eighth connection via.

An angle between the reset-forwarding wire 1084 and the reset-connecting wire 1082 is an acute angle.

In an embodiment, the power line VDD is integrated with the second electrode plate 1081 of the storage capacitor. A sum of a width of the power line VDD and a width of the second electrode plate of the storage capacitor is equal to a width of the first electrode plate 1061 of the storage capacitor.

In an embodiment, refer to FIGS. 7 to 10, the gate layer 106 is located over active layer 104, in the array substrate provided by the present disclosure.

In this embodiment, the gate layer 106 includes the gate, the signal-resetting wire VI, the scan lines Scan(N), Scan(N−1), the enable signal wire Em, and the first electrode plate 1061 of the storage capacitor. The gate layer 106 includes the gate, the signal-resetting wire VI, the scan lines Scan(N), Scan(N−1), the enable signal wire Em, and the first electrode plate 1061 of the storage capacitor, are formed by a same photomask process.

In an embodiment, the first electrode plate 1061 of the storage capacitor formed within the gate layer 106 has a protruding portion. The interlayer dielectric layer 107 is provided with a third connection via within a region corresponding to the protruding portion. The protruding portion is shaped as at least one of a rectangle, a trapezoid, a circular ring, or a triangle. In this embodiment, the protruding portion is shaped as a rectangle.

The source/drain layer 108 is located over the gate layer 106.

In this embodiment, the source/drain layer 108 includes the source, the drain, the data signal wire Vdata, the power line VDD, the second electrode plate 1081 of the storage capacitor, the reset-connecting wire 1082, the second connection wire 1083, the reset-forwarding wire 1084, and the power connection wire 1085. The source, the drain, the data signal wire Vdata, the power line VDD, the second electrode plate 1081 of the storage capacitor, the reset-connecting wire 1082, the second connection wire 1083, the reset-forwarding wire 1084, and the power connection wire 1085, are formed by a same photomask process.

In an embodiment, one end of the second connection wire 1083 is connected to the first electrode plate 1061 through the third connection via, and the other end of the second connection wire 1083 is connected to the active layer 104 through the fourth connection via.

In an embodiment, one end of the reset-connecting wire 1082 is connected to the signal-resetting wire VI through the fifth connection via, and the other end of the reset-connecting wire 1082 is connected to the signal-resetting wire VI of the neighboring sub-pixel. The reset-connecting wire 1082 is parallel to the signal-resetting wire VI.

The width of the reset-connecting wire 1082 is greater than the width of the signal-resetting wire VI, in order to decrease the resistance and reduce the voltage drop.

In an embodiment, one end of the reset-forwarding wire 1084 is connected to the signal-resetting wire VI through the seventh connection via, and the other end of the reset-forwarding wire 1084 is connected to the active layer 104 through the eighth connection via.

The angle between the reset-forwarding wire 1084 and the reset-connecting wire 1082 is an acute angle.

In an embodiment, the second electrode plate 1081 is connected to the power line VDD via the power connection wire 1085. The power connection wire 1085 is perpendicular to the power line VDD and a side of the second electrode plate 1081. In addition, a number of the power connection wire 1085 is greater than two.

The power connection wire 1085 has a hollow mesh-shaped structure to form a circuit in parallel for transmitting data signals, thereby reducing the resistance of the metal wire transmitting the data signals and reducing the voltage drop. In addition, a design of the mesh-shaped structure can reduce an abnormal disconnection circuit due to disconnecting metal wires.

Meanwhile, the present disclosure also provides a display panel, which includes an array substrate including:
a substrate;
a buffer layer formed over the substrate;
an active layer formed on the buffer layer and patterned to form an active region of a thin film transistor, wherein the active region includes doped regions and a channel region;
a gate insulation layer formed on the active layer and the buffer layer;
a gate layer formed on the gate insulation layer and patterned to form a first electrode plate of a storage capacitor, a gate, and scan lines;
an interlayer dielectric layer formed on the gate layer and the gate insulation layer;
a source/drain layer formed on the interlayer dielectric layer and patterned to form a second electrode plate of the storage capacitor, a source, and a drain; and
a passivation layer formed on the source/drain layer and the interlayer dielectric layer.

This embodiment of the present disclosure provides a display panel, which includes the array substrate. The array substrate includes the substrate, the buffer layer, the active layer, the gate insulation layer, the gate layer, the interlayer dielectric layer, the source/drain layer, and the passivation layer, which are arranged in a stacked manner. By adopting a design of a single-gated layer, a first electrode plate of a storage capacitor is formed within the gate layer, and a second electrode plate of the storage capacitor and various functional connection wires are formed within a source/drain layer. Paths used for electric current between different film layers are realized by various functional connection wires. Therefore, one layer of a gated structure is omitted, one photomask process is saved, production cost is reduced, and a problem of high production cost of the current display devices is solved.

In an embodiment, the second electrode plate is provided with a notch, and a first connection via is provided within a region corresponding to the notch. The source/drain layer is further patterned to form a first connection wire. One end of the first connection wire is connected to the first electrode plate through the first connection via, and the other end of the first connection wire is connected to doped regions of a target thin film transistor through a second connection via.

In an embodiment, the first electrode plate is provided with a protruding portion, and a third connection via is provided within a region corresponding to the protruding portion; and the source/drain layer is further patterned to form a second connection wire. One end of the second connection wire is connected to the first electrode plate through the third connection via, and the other end of the second connection wire is connected to doped regions of a target thin film transistor through a fourth connection via.

In an embodiment, the source/drain layer is further patterned to form a power line and a power connection wire, and the second electrode plate is connected to the power line via the power connection wire.

In an embodiment, the source/drain layer is further patterned to form a power line, and one side of the second electrode plate is integrated with the power line.

In an embodiment, the gate layer is further patterned to form a signal-resetting wire, and the signal-resetting wire is disconnected within a region corresponding to the active region. In addition, the source/drain layer is further patterned to form a reset-connecting wire, the signal-resetting wire is connected to one end of the reset-connecting wire through a fifth connection via, and the other end of the reset-connecting wire is connected to a signal-resetting wire of a neighboring sub-pixel through a sixth connection via.

In an embodiment, the source/drain layer is further patterned to form a reset-forwarding wire, the signal-resetting wire is connected to one end of the reset-forwarding wire through a seven connection via, and the other end of the reset-forwarding wire is connected to a channel region of a target thin film transistor through an eighth connection via.

In an embodiment, the display panel is a display panel configured for a liquid crystal display (LCD), which includes:
a color film substrate; and
liquid crystal filled between the color film substrate and the array substrate.

In another embodiment, the display panel is an organic light emitting diode (OLED) type display panel, which includes:
a pixel definition layer formed over the passivation layer and patterned to form a light-emitting definition region;
a light-emitting material layer formed within the light-emitting definition region;
a common electrode layer formed over the light-emitting material layer and the pixel definition layer; and
an encapsulation layer formed over the common electrode layer.

Meanwhile, the present disclosure further provides a method for preparing an array substrate, which includes:
a step S1 of providing a substrate;
a step S2 of preparing a buffer layer over the substrate;
a step S3 of preparing an active layer on the buffer layer, which is patterned to form an active region of a thin film transistor, wherein the active region has doping regions and a channel region;
a step S4 of preparing a gate insulation layer on the active layer and the buffer layer;
a step S5 of preparing a gate layer on the gate insulation layer, which is patterned to form a first electrode plate of a storage capacitor, a gate, and scan lines;
a step S6 of preparing an interlayer dielectric layer on the gate layer and the gate insulation layer;
a step S7 of preparing a source/drain layer on the interlayer dielectric layer and patterning for forming a second electrode plate of the storage capacitor, a source, and a drain; and a step S8 of preparing a passivation layer on the source/drain layer and the interlayer dielectric layer.

This embodiment provides a method for preparing an array substrate, which sequentially prepares the buffer layer, the active layer, the gate insulation layer, the gate layer, the interlayer dielectric layer, the source/drain layer, and the passivation layer over the substrate. By adopting a design of a single-gated layer, a first electrode plate of a storage capacitor is formed within the gate layer, and a second electrode plate of the storage capacitor and various functional connection wires are formed within a source/drain layer. Paths used for electric current between different film layers are realized by various functional connection wires. Therefore, one layer of a gated structure is omitted, one photomask process is saved, production cost is reduced, and a problem of high production cost of the current display devices is solved.

According to the above embodiments, it should be known as follows.

The embodiments of the present disclosure provide an array substrate, a display panel, and a method for preparing the array substrate. The array substrate includes the substrate, the buffer layer, the active layer, the gate insulation layer, the gate layer, the interlayer dielectric layer, the source/drain layer, and the passivation layer, which are arranged in sequence. By adopting a design of a single-gated layer, a first electrode plate of a storage capacitor is formed within the gate layer, and a second electrode plate of the storage capacitor and various functional connection wires are formed within a source/drain layer. Paths used for electric current between different film layers are realized by various functional connection wires. Therefore, one layer of a gated structure is omitted, one photomask process is saved, production cost is reduced, and a problem of high production cost of the current display devices is solved.

In summary, although the present disclosure has been disclosed in the above preferred embodiments, the above preferred embodiments are not intended to limit the present disclosure. In addition, various modifications and changes may be made by those skilled in the art without departing from the spirit and scope of this application. Therefore, the scope of protection of the present disclosure is subject to a scope defined by the claims.

What is claimed is:

1. An array substrate, comprising:
   a substrate;
   a buffer layer formed over the substrate;
   an active layer formed on the buffer layer and patterned to form an active region of a thin film transistor, wherein the active region comprises doped regions and a channel region;
   a gate insulation layer formed on the active layer and the buffer layer;
   a gate layer formed on the gate insulation layer and patterned to form a first electrode plate of a storage capacitor, a gate, and scan lines;
   an interlayer dielectric layer formed on the gate layer and the gate insulation layer;
   a source/drain layer formed on the interlayer dielectric layer and patterned to form a second electrode plate of the storage capacitor, a source, and a drain; and
   a passivation layer formed on the source/drain layer and the interlayer dielectric layer.

2. The array substrate as claimed in claim 1, wherein the second electrode plate is provided with a notch, and a first connection via is provided within a region corresponding to the notch; and the source/drain layer is further patterned to form a first connection wire, one end of the first connection wire is connected to the first electrode plate through the first connection via, and the other end of the first connection wire is connected to doped regions of a target thin film transistor through a second connection via.

3. The array substrate as claimed in claim 1, wherein the first electrode plate is provided with a protruding portion, and a third connection via is provided within a region corresponding to the protruding portion; and the source/drain layer is further patterned to form a second connection wire, one end of the second connection wire is connected to the first electrode plate through the third connection via, and the other end of the second connection wire is connected to doped regions of a target thin film transistor through a fourth connection via.

4. The array substrate as claimed in claim 1, wherein the source/drain layer is further patterned to form a power line and a power connection wire, and the second electrode plate is connected to the power line via the power connection wire.

5. The array substrate as claimed in claim 4, wherein the power connection wire has a hollow mesh-shaped structure.

6. The array substrate as claimed in claim 1, wherein the source/drain layer is further patterned to form a power line, and one side of the second electrode plate is integrated with the power line.

7. The array substrate as claimed in claim 1, wherein the gate layer is further patterned to form a signal-resetting wire, the signal-resetting wire is disconnected within a region corresponding to the active region; and the source/drain layer is further patterned to form a reset-connecting wire, the signal-resetting wire is connected to one end of the reset-connecting wire through a fifth connection via, and the other end of the reset-connecting wire is connected to a signal-resetting wire of a neighboring sub-pixel through a sixth connection via.

8. The array substrate as claimed in claim 7, wherein the source/drain layer is further patterned to form a reset-forwarding wire, the signal-resetting wire is connected to one end of the reset-forwarding wire through a seven connection via, and the other end of the reset-forwarding wire is connected to a channel region of a target thin film transistor through an eighth connection via.

9. The array substrate as claimed in claim 1, wherein a material of the source/drain layer is at least one of molybdenum, aluminum, aluminum-nickel alloy, molybdenum-tungsten alloy, chromium, copper, or titanium-aluminum alloy.

10. The array substrate as claimed in claim 1, wherein a material of the interlayer dielectric layer is silicon nitride or silicon oxide.

11. The array substrate as claimed in claim 1, wherein a material of the gate layer is at least one of molybdenum, aluminum, aluminum-nickel alloy, molybdenum-tungsten alloy, chromium, copper, or titanium-aluminum alloy.

12. The array substrate as claimed in claim 1, wherein a material of the gate insulation layer is at least one of silicon nitride, silicon oxide, or silicon oxynitride.

13. The array substrate as claimed in claim 1, wherein a material of the buffer layer is at least one of silicon nitride or silicon oxide.

14. The array substrate as claimed in claim 1, wherein a material of the barrier layer is silicon oxide.

15. The array substrate as claimed in claim 1, wherein the substrate is one of a glass substrate, a quartz substrate, or a resin substrate.

16. The array substrate as claimed in claim 1, wherein the substrate is a flexible substrate.

17. The array substrate as claimed in claim 16, wherein material of the substrate being the flexible substrate comprises Polyimide.

18. A display panel, comprising the array substrate as claimed in claim 1.

19. The display panel as claimed in claim 18, being a display panel configured for a liquid crystal display (LCD), which further comprises:
   a color film substrate; and
   liquid crystal filled between the color film substrate and the array substrate.

20. The display panel as claimed in claim 18, being a display panel configured for an organic light emitting diode (OLED), which further comprises:
   a pixel definition layer formed over the passivation layer and patterned to form a light-emitting definition region;
   a light-emitting material layer formed within the light-emitting definition region;
   a common electrode layer formed over the light-emitting material layer and the pixel definition layer; and
   an encapsulation layer formed over the common electrode layer.

* * * * *